United States Patent
Nallan et al.

(10) Patent No.: US 6,806,095 B2
(45) Date of Patent: Oct. 19, 2004

(54) METHOD OF PLASMA ETCHING OF HIGH-K DIELECTRIC MATERIALS WITH HIGH SELECTIVITY TO UNDERLYING LAYERS

(76) Inventors: Padmapani C. Nallan, 2200 Pettigrew Dr., San Jose, CA (US) 95148; Guangxiang Jin, 1738 Fumia Dr., San Jose, CA (US) 95131; Ajay Kumar, 510 Kenilworth Ct., Sunnyvale, CA (US) 94087

(*) Notice: Subject to any disclaimer, the term of this patent is extended or adjusted under 35 U.S.C. 154(b) by 0 days.

(21) Appl. No.: 10/092,795

(22) Filed: Mar. 6, 2002

(65) Prior Publication Data

US 2003/0170986 A1 Sep. 11, 2003

(51) Int. Cl.⁷ ............................................. H01L 21/00
(52) U.S. Cl. ........................ 438/3; 438/240; 438/711; 438/722
(58) Field of Search ................................. 438/720, 722, 438/3, 240, 689, 706, 708, 709, 711

(56) References Cited

U.S. PATENT DOCUMENTS

| | | | |
|---|---|---|---|
| 5,071,714 A | 12/1991 | Rodbell et al. | 428/620 |
| 5,188,979 A | 2/1993 | Filipiak | 437/192 |
| 5,337,207 A | 8/1994 | Jones et al. | 361/321.1 |
| 5,356,833 A | 10/1994 | Maniar et al. | 437/187 |
| 6,270,568 B1 | 8/2001 | Droopad et al. | 117/4 |
| 6,284,146 B1 * | 9/2001 | Kim et al. | 216/6 |
| 6,297,095 B1 | 10/2001 | Muralidhar et al. | 438/257 |
| 6,300,202 B1 | 10/2001 | Hobbs et al. | 438/287 |
| 6,319,730 B1 | 11/2001 | Ramdani et al. | 438/3 |
| 6,326,261 B1 | 12/2001 | Tsang et al. | 438/243 |
| 6,348,386 B1 | 2/2002 | Gilmer | 438/288 |
| 6,528,386 B1 | 3/2003 | Summerfelt et al. | 438/401 |
| 2001/0055852 A1 * | 12/2001 | Moise et al. | 438/396 |
| 2002/0076936 A1 * | 6/2002 | Iguchi | 438/710 |
| 2003/0032237 A1 | 2/2003 | Clevenger et al. | 438/243 |
| 2003/0036241 A1 | 2/2003 | Tews | 438/386 |

FOREIGN PATENT DOCUMENTS

WO        01/97257        12/2001

* cited by examiner

*Primary Examiner*—Tuan H. Nguyen
(74) *Attorney, Agent, or Firm*—Moser, Patterson & Sheridan, L.L.P.; Joseph Bach

(57) ABSTRACT

A method of etching high dielectric constant materials using halogen gas and reducing gas chemistry. An embodiment of the method is accomplished using a 20 to 300 sccm of chlorine and 2 to 200 sccm of carbon monoxide, regulated to a total chamber pressure of 2–100 mTorr to etch a hafnium oxide layer.

17 Claims, 4 Drawing Sheets

400

| PROCESS OF THE PRESENT INVENTION UTILIZING A DPS CHAMBER | | | | |
|---|---|---|---|---|
| PARAMETER | UNITS | RANGE | | PREFERABLY |
| | | MIN | MAX | |
| $Cl_2$ | SCCM | 20 | 300 | 40 |
| CO | SCCM | 2 | 200 | 40 |
| TOTAL PRESSURE | mTORR | 2 | 100 | 4 |
| ANTENNA POWER | WATTS | 200 | 2500 | 1100 |
| PEDESTAL POWER | WATTS | 5 | 100 | 20 |
| PEDESTAL TEMPERATURE | DEGREES CELSIUS | 100 | 500 | 350 |

*FIG. 4*

METHOD OF PLASMA ETCHING OF HIGH-K DIELECTRIC MATERIALS WITH HIGH SELECTIVITY TO UNDERLYING LAYERS

BACKGROUND OF THE INVENTION

1. Field of Invention

The present invention relates generally to a method of dry etching semiconductor wafers. More specifically, the invention relates to a method of etching high K dielectric materials using a gas mixture comprising a halogen gas and a reducing gas.

2. Description of the Background Art

Field effect transistors that are used in forming integrated circuit generally utilize a polysilicon gate electrodes deposited upon a gate dielectric that separates the electrode from the channel between source and drain regions. In prior art transistor structures, the gate dielectric is typically fabricated of silicon dioxide ($SiO_2$). However, as integrated circuit transistors have become smaller (on the order of 100 nanometers in width), the thickness of the dielectric material in the gate structure has become thinner than 10 Angstroms. With such a thin dielectric, electrons can propagate from the polysilicon gate electrode into the transistor channel causing the transistor to operate improperly or become defective.

This leakage of electrons from the gate electrode through the gate oxide has led researchers to investigate the use of more stable high K dielectric materials. One very stable dielectric material having a high dielectric constant is hafnium-oxide ($HfO_2$). However, hafnium-oxide is such a stable dielectric material that it is very difficult to etch using conventional oxide etchants to form into gate structures without damaging other layers of material residing on the wafer. As such, hafnium-oxide has found limited use in semiconductor devices.

Therefore, there is a need in the art for a high K material etching process having very high selectivity to silicon oxide, polysilicon and silicon.

SUMMARY OF INVENTION

The disadvantages associated with the prior art are overcome by the present invention for etching materials with high dielectric constants (high K materials have a dielectric constant greater than 4.0) such as HfO2, ZrO2, $Al_2O_3$, BST, PZK, $ZrSiO_2$, $HFSiO_2$, $TaO_2$, and the like using a gas mixture comprising a halogen gas and reducing gas. In one embodiment of the invention, an etch gas (or mixture) comprising chlorine ($Cl_2$) and carbon monoxide (CO) is used for etching hafnium-oxide films. In one example, the gas flow rates are in the range 20–300 sccm $Cl_2$ and about 2–200 sccm CO (i.e., a $CL_2$/CO flow ratio (0.1–1):(1–0.1)), with a total chamber pressure in the range of 2–100 mTorr.

A decoupled plasma source etch reactor is illustratively used to practice one embodiment of the present invention. In general, the reactor uses an inductive source power of about 200–2500 W for plasma generation, and applies a cathode bias power of about 5–100 W to a wafer support pedestal. The reactor maintains the pedestal within a temperature range of about 100 to 500 degrees Celsius. The invention can be practiced, for example, by supplying to the reactor a combination of about 40 sccm of chlorine gas and about 40 sccm of carbon monoxide gas, while maintaining a total chamber pressure of about 4 mTorr. The gas mixture is supplied to the reaction chamber wherein a plasma is formed and a hafnium-oxide layer is etched.

BRIEF DESCRIPTION OF DRAWINGS

The teachings of the present invention can be readily understood by considering the following detailed description in conjunction with the accompanying drawings, in which:

FIG. 4 is a table summarizing the processing parameters of one embodiment of the inventive method when practiced using the apparatus of FIG. 1.

To facilitate understanding, identical reference numerals have been used, where possible, to designate identical element that are common to the figures.

DETAIL DESCRIPTION OF EMBODIMENTS OF INVENTION

The present invention is a method of etching materials with high dielectric constants (high K materials have dielectric constants greater than 4.0) using a plasma generated from a gas (or gas mixture) comprising gases containing a halogen gas (such as $Cl_2$, HCl and the like) and a reducing gas (such as carbon monoxide (CO). The high K materials include $HfO_2$, $ZrO_2$, $Al_2O_3$, BST, PZK, $ZrSiO_2$, $HfSiO_2$, $TaO_2$, and the like. The type of halogen gas is selected to best remove the metal from the dielectric layer and the type of reducing gas is selected to best remove the oxygen from the dielectric layer. The etch process of the present invention can be reduced to practice in a Decoupled Plasma Source (DPS) Centura® etch system or a DPS-II etch system available from Applied Materials, Inc. of Santa Clara, Calif.

Figure 1:
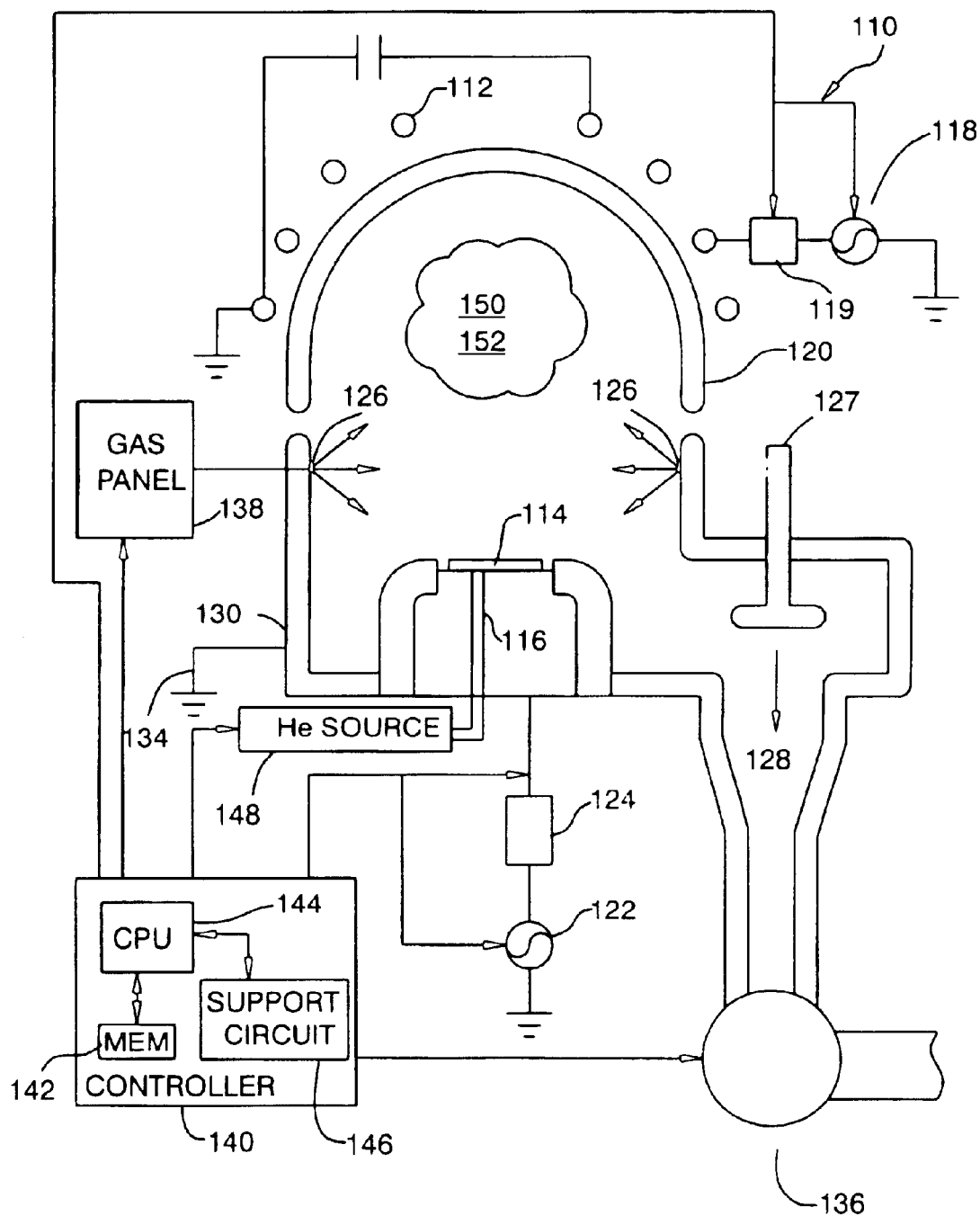
FIG. 1 depicts a schematic diagram of a plasma processing apparatus of the kind used in performing the etching processes according to one embodiment of the present invention.

FIG. 1 depicts a schematic diagram of the DPS etch process chamber 110, that comprises at least one inductive coil antenna segment 112, positioned exterior to a dielectric, dome-shaped ceiling 120 (referred to herein as the dome 120). Other chambers may have other types of ceilings, e.g., a flat ceiling. The antenna segment 112 is coupled to a radio-frequency (RF) source 118 (that is generally capable of producing an RF signal having a tunable frequency of about 12.56 MHz). The RF source 118 is coupled to the antenna 112 through a matching network 119. Process chamber 110 also includes a substrate support pedestal (cathode) 116 that is coupled to a second RF source 122 that is generally capable of producing an RF signal having a frequency of approximately 13.56 MHz. The source 122 is coupled to the cathode 116 through a matching network 124. The chamber 110 also contains a conductive chamber wall 130 that is connected to an electrical ground 134. A controller 140 comprising a central processing unit (CPU) 144, a memory 142, and support circuits 146 for the CPU 144 is coupled to the various components of the DPS etch process chamber 110 to facilitate control of the etch process.

In operation, the semiconductor substrate 114 is placed on the substrate support pedestal 116 and gaseous components are supplied from a gas panel 138 to the process chamber 110 through entry ports 126 to form a gaseous mixture 150. The gaseous mixture 150 is ignited into a plasma 152 in the process chamber 110 by applying RF power from the RF sources 118 and 122 respectively to the antenna 112 and the cathode 116. The pressure within the interior of the etch chamber 110 is controlled using a throttle valve 127 situated between the chamber 110 and a vacuum pump 136. The temperature at the surface of the chamber walls 130 is controlled using liquid-containing conduits (not shown) that are located in the walls 130 of the chamber 110.

The temperature of the substrate 114 is controlled by stabilizing the temperature of the support pedestal 116 and flowing helium gas from source 148 to channels formed by the back of the substrate 114 and grooves (not shown) on the pedestal surface. The helium gas is used to facilitate heat transfer between the pedestal 116 and the substrate 114. During the etch process, the substrate 114 is heated by a resistive heater within the pedestal to a steady state temperature and the helium facilitates uniform heating of the substrate 114. Using thermal control of both the dome 120 and the pedestal 116, the substrate 114 is maintained at a temperature of between 100 and 500 degrees Celsius.

The RF power applied to the inductive coil antenna 112 has a frequency between 50 kHz and 13.56 MHz and has a power of 200 to 2500 Watts. The bias power applied to the pedestal 116 may be DC or RF and is between 5 and 100 Watts.

Those skilled in the art will understand that other forms of etch chambers may be used to practice the invention, including chambers with remote plasma sources, microwave plasma chambers, electron cyclotron resonance (ECR) plasma chambers, and the like.

To facilitate control of the chamber as described above, the CPU 144 may be one of any form of general purpose computer processor that can be used in an industrial setting for controlling various chambers and subprocessors. The memory 142 is coupled to the CPU 144. The memory 142, or computer-readable medium, may be one or more of readily available memory such as random access memory (RAM), read only memory (ROM), floppy disk, hard disk, or any other form of digital storage, local or remote. The support circuits 146 are coupled to the CPU 144 for supporting the processor in a conventional manner. These circuits include cache, power supplies, clock circuits, input/output circuitry and subsystems, and the like. An etching process 200 is generally stored in the memory 142 as a software routine 202. The software routine 202 may also be stored and/or executed by a second CPU (not shown) that is remotely located from the hardware being controlled by the CPU 144.

Figure 2:
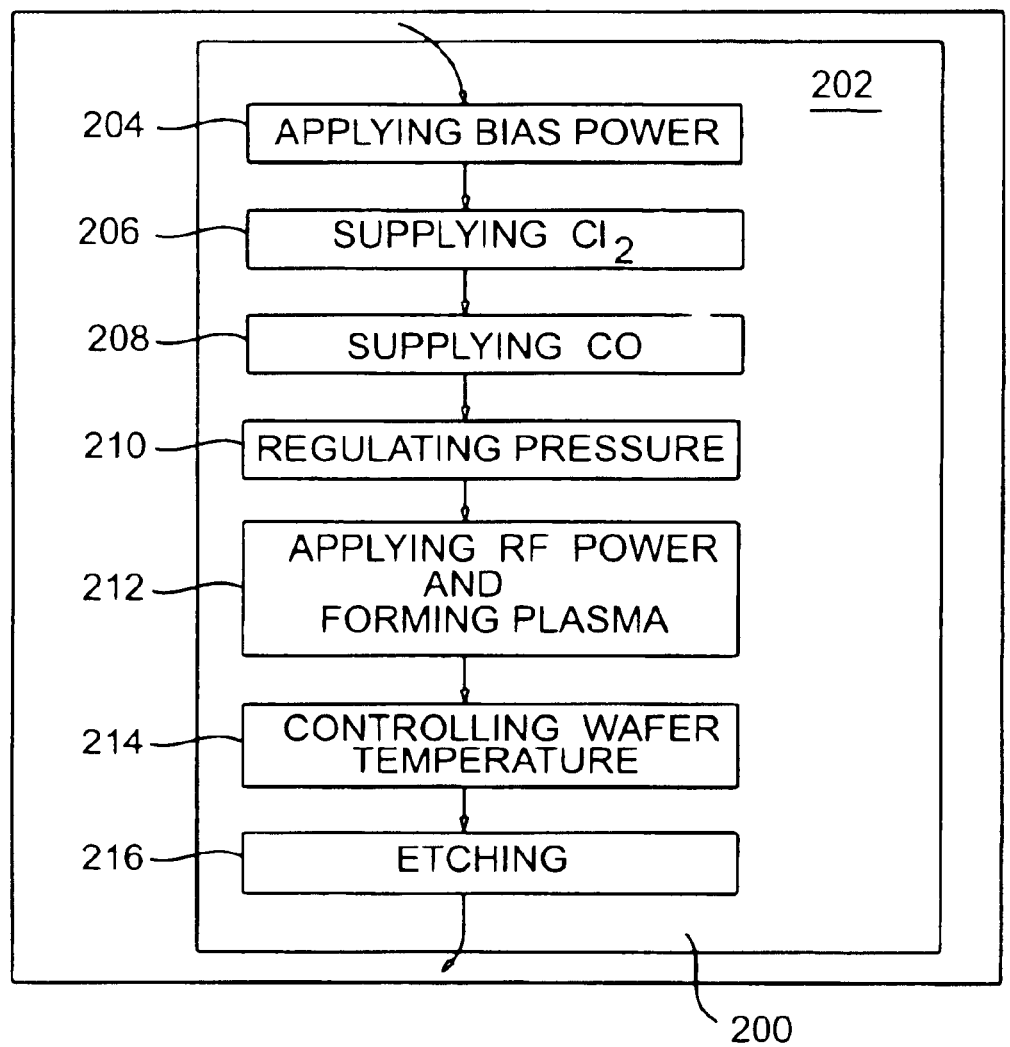
FIG. 2 depicts a flow diagram of an example of the inventive process.

The specific embodiment of the etching process 200 depicted in FIG. 2 comprises the steps of applying bias power to the pedestal (step 204), supplying gas containing chlorine (i.e., $Cl_2$) to the chamber 100 (step 206), supplying CO to the chamber 100 (step 208), regulating the pressure of the $Cl_2$ and CO (step 210), applying RF power and forming a plasma (step 212), controlling the wafer temperature (step 214), and etching the hafnium-oxide (step 216). The etching step 216 has a duration that continues until an unmasked portion of hafnium-oxide is removed. The etch time is terminated upon a certain optical emission occurring, upon a particular duration occurring or upon some other indicator determining that the hafnium-oxide has been removed.

The foregoing steps of the process 200 need not be performed sequentially. For example, some or all of the steps may be performed simultaneously to etch a hafnium-oxide or other high K dielectric layer.

The foregoing steps of the process 200 need not be performed sequentially. For example, some or all of the steps may be performed simultaneously to etch a hafnium-oxide or other high K dielectric layer.

The software routine 202 is discussed with respect to FIG. 1 and FIG. 2. The software routine 202 is executed after a wafer 114 is positioned on the pedestal 116. The software routine 202 when executed by the CPU 144, transforms the general purpose computer into a specific purpose computer (controller) 140 that controls the chamber operation such that the etching process 200 is performed. Although the process of the present invention is discussed as being implemented as a software routine, some of the method steps that are disclosed therein may be performed in hardware as well as by the software controller. As such, the invention may be implemented in software as executed upon a computer system, in hardware as an application specific integrated circuit or other type of hardware implementation, or a combination of software and hardware.

Continuing to refer to FIG. 1 and FIG. 2, a wafer or other form of workpiece 114 is etched, for example, by applying a bias power in the range of 5–100 Watts to the pedestal 116 in step 204. The gaseous mixture 150 is supplied to the chamber 110 at a rate in the range of 20–300 sccm $Cl_2$ and 2–200 sccm CO in steps 206 and 208, respectively. Such flow rates define a flow ratio of $Cl_2$ to CO in the range of (0.1–1):(1–0.1). In step 210, the total pressure of the gas mixture 150 is regulated to be maintained in the range of 2–100 mTorr.

Once the gas mixture 150 is present above the wafer 114, step 212 applies 200–2500 Watts of RF power to the antenna 112, and plasma 152 is formed. The wafer 114 is heated to 100–500 degrees Celsius in step 214. Etching of the wafer 114 occurs in step 216. One specific recipe for etching hafnium-oxide uses a pedestal bias power of 20 watts, 40 sccm of $Cl_2$, 40 sccm of CO, a chamber pressure of 4 mTorr, an antenna power of 1100 watts and a pedestal temperature of 3500° C.

FIG. 4 presents a table 400 summarizing the etch process parameters through which one can practice the invention using a DPS Centura® system. The etch process parameters for the embodiment of the invention presented above are summarized in column 402. The process ranges are presented in column 404. It should be understood, however, that the use of a different chamber may necessitate different process parameter values and ranges.

Figure 3A:
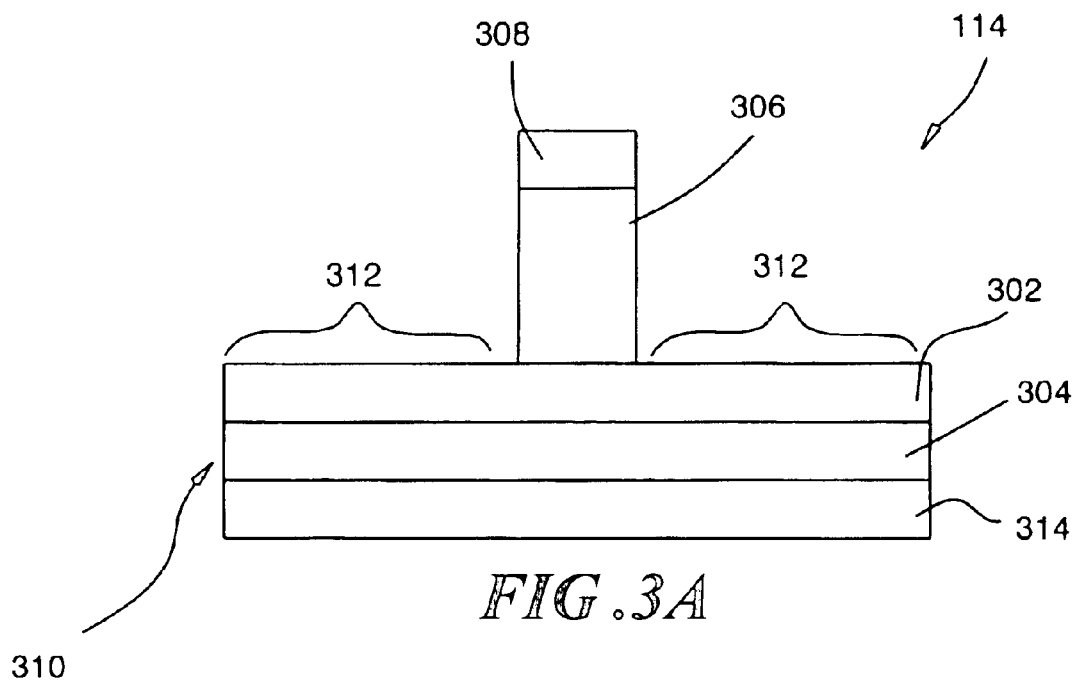
FIG. 3a depicts a schematic cross-sectional view of a wafer having a hafnium-oxide layer of the kind used in performing the etching processes according to an example of the present invention.

One illustrative embodiment of the inventive process is used for etching a wafer 114 containing a film stack 310 of FIG. 3a to form a gate structure of a transistor. The wafer 114 comprise a doped layer 314, a silicon dioxide layer 304 (optional), a high K dielectric layer 302, a polysilicon layer 306, and an etch mask 308. The film stack 310 comprises a layer of polysilicon 306 that has been previously etched to a form defined by the patterned photoresist mask 308. The photoresist 306 is patterned to leave a portion 312 of the high K dielectric layer 302 exposed to the etch chemistry. An underlying, optional silicon dioxide layer 304 will be conventionally etched after the high K dielectric in region 312 is removed. The film stack 310 is deposited upon a wafer having a doped layer 314 that forms the channel of a transistor. In one embodiment where the high K dielectric material is hafniumoxide, the hafnium-oxide is etched by the $Cl_2$/CO chemistry at a rate of about 200 Å/min with a selectivity to $SiO_2$ of greater than 60:1. The selectivity to silicon and polysilicon is greater than 3:1.

Figure 3B:
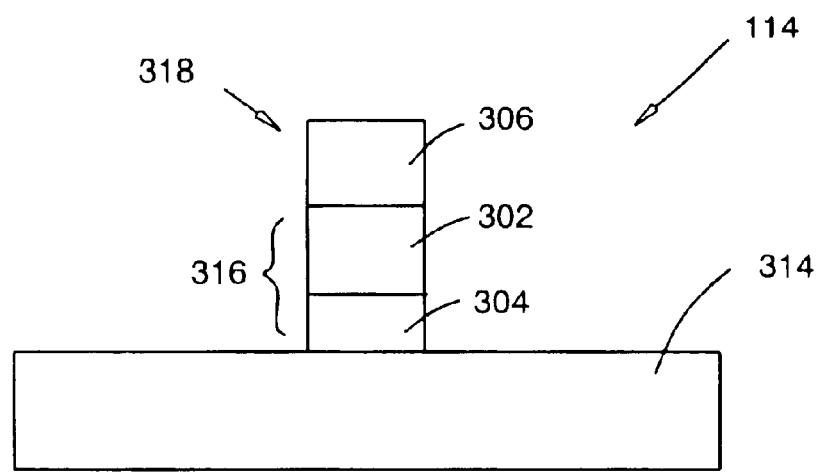
FIG. 3b depicts a schematic cross-sectional view of a gate structure comprising the hafnium-oxide layer of FIG. 3a that has been etched using a chlorine and carbon monoxide etching chemistry according to an example of the present invention.

The result of the inventive etching method is best appreciated by referring to a gate structure depicted in FIG. 3b. The profile illustrates a wafer 114 having the doped layer 314 that forms the channel of a transistor and a gate stack 318. The gate stack 318 comprises a gate dielectric 316 and a gate electrode 306. The gate electrode comprises a polysilicon layer and the gate dielectric 316 comprises a high K dielectric layer 302 on top of a silicon dioxide layer 304. The high K dielectric layer ensures that, during transistor operation, electrons will not flow from the gate electrode to the channel. As such, the gate dielectric can be made very thin, e.g., about 5 nm. At 5 nm, the silicon dioxide layer is 2 nm thick and the high K dielectric layer is 3 nm thick. Alternatively, the $SiO_2$ layer may not be present and the high K dielectric layer may reside between the channel and the polysilicon layer.

The invention may be practiced in other etching equipment wherein the processing parameters may be adjusted to achieve acceptable etch characteristics by those skilled in the arts by utilizing the teachings disclosed herein without departing from the spirit of the invention.

What is claimed is:

1. A method of plasma etching a layer of a dielectric material having a dielectric constant that is greater than 4, comprising:

exposing the layer to a plasma comprising carbon monoxide and a halogen containing gas, wherein the dielectric material is at least one of $HfO_2$, $ZrO_2$, $Al_2O_3$, $ZrSiO_2$, $HfSiO_2$, and $TaO_2$.

2. The method of claim 1 wherein the halogen containing gas comprises a chlorine containing gas.

3. The method of claim 2 wherein said chlorine containing gas is $Cl_2$.

4. The method of claim 1 wherein halogen gas comprises chlorine.

5. The method of claim 4 wherein said exposing step further comprises the step of:

supplying 20 to 300 sccm of $Cl_2$ and 2 to 200 sccm of CO.

6. The method of claim 4 further comprising the step of:

maintaining a gas pressure of 4 mTorr.

7. The method of claim 4 further comprising the step of:

applying a bias power to a cathode electrode of 20 W.

8. The method of claim 4 further comprising the step of:

applying an inductive source power to an inductively coupled antenna of 1100 W.

9. The method of claim 1 further comprising the step of:

maintaining a gas pressure of between 2–100 mTorr.

10. The method of claim 1 further comprising the step of:

applying a bias power to a cathode electrode of 5 to 100 W.

11. A The method of claim 1 further comprising the step of:

applying an inductive source power to an inductively coupled antenna of 200 to 2500 W.

12. A method of plasma etching a layer of a dielectric material comprising:

exposing a layer of $HfO_2$ to a plasma comprising carbon monoxide and a halogen containing gas.

13. The method of claim 12 further comprising the step of:

maintaining a workpiece containing the layer of $HfO_2$ at a temperature between 100 to 500 degrees Celsius.

14. The method of claim 12 further comprising the step of:

maintaining a workpiece containing the layer of $HfO_2$ at a temperature of 350 degrees Celsius.

15. The method of claim 12 wherein the halogen containing gas is chlorine.

16. The method of claim 12 wherein the halogen containing gas is hydrogen chlorine.

17. A method for plasma etching a workpiece having a layer of hafnium-oxide comprising the steps of:

supplying between 20 to 300 sccm of chlorine and between 2 to 200 sccm of carbon monoxide;

maintaining a gas pressure of between 2–100 mTorr;

applying a bias power to a cathode electrode of between 5 to 100 W;

applying power to an inductively coupled antenna of between 200 to 2500 W to produce a plasma containing said chlorine gas and said carbon monoxide gas;

maintaining said workpiece at a temperature between 100 and 500 degrees Celsius.

* * * * *

UNITED STATES PATENT AND TRADEMARK OFFICE
CERTIFICATE OF CORRECTION

PATENT NO. : 6,806,095 B2
APPLICATION NO. : 10/092795
DATED : October 19, 2004
INVENTOR(S) : Nallan et al.

It is certified that error appears in the above-identified patent and that said Letters Patent is hereby corrected as shown below:

On the Title page, in field (56), under "Foreign Patent Documents", in column 2, line1, after "12/2001" insert -- H01L --.
In column 1, line 46, delete "HfO2, ZrO2" and insert -- $HfO_2$, $ZrO_2$ --, therefor.
In column 1, line 47, delete "HFSiO$_2$" and insert -- $HfSiO_2$--, therefor.
In column 1, line 53, delete "CL$_2$/CO" and insert -- $Cl_2$/CO --, therefor.
In columns 3-4, lines 66-67 and 1-2, below "The foregoing steps of the………dielectric layer." delete "The foregoing steps of the………dieletric layer.".
(Repeated occurrence)
In column 4, line 40, delete "3500° C" and insert -- 350° C--, therefor.
In column 4, line 64, delete "hafniumoxide" and insert -- hafnium-oxide --, therefor.
In column 6, line 10, in Claim 11, delete "A" before "The".
In column 6, line 16, in Claim 12, after "material" insert -- , --.
In column 6, line 39, in Claim 17, after "gas;" insert -- and --.

Signed and Sealed this

Twenty-sixth Day of December, 2006

JON W. DUDAS
*Director of the United States Patent and Trademark Office*